US012598843B2

(12) United States Patent
Chen et al.

(10) Patent No.: US 12,598,843 B2
(45) Date of Patent: Apr. 7, 2026

(54) MICRO LIGHT-EMITTING DIODE DISPLAY DEVICE

(71) Applicant: PlayNitride Display Co., Ltd., MiaoLi County (TW)

(72) Inventors: Yen-Yeh Chen, MiaoLi County (TW); Yu-Jui Tseng, MiaoLi County (TW); Chih-Ling Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 881 days.

(21) Appl. No.: 17/853,929

(22) Filed: Jun. 30, 2022

(65) Prior Publication Data

US 2023/0055323 A1     Feb. 23, 2023

(30) Foreign Application Priority Data

Aug. 20, 2021     (TW) ................................. 110130934

(51) Int. Cl.
H10H 20/857          (2025.01)
H01L 25/075          (2006.01)
(Continued)

(52) U.S. Cl.
CPC ..... H10H 20/8514 (2025.01); H01L 25/0753 (2013.01); H10H 20/856 (2025.01);
(Continued)

(58) Field of Classification Search
CPC ............. H10H 20/032; H10H 20/8514; H10H 20/856; H10H 20/857; H10H 20/819; H10H 29/142; H01L 25/0753; H01L 25/167
See application file for complete search history.

(56) References Cited

U.S. PATENT DOCUMENTS

| | | | |
|---|---|---|---|
| 11,705,536 B2 * | 7/2023 | Iguchi | G09G 3/32 |
| | | | 257/79 |
| 2014/0209955 A1 * | 7/2014 | Kim | H10H 20/857 |
| | | | 257/99 |

(Continued)

FOREIGN PATENT DOCUMENTS

| | | |
|---|---|---|
| CN | 105633239 | 6/2016 |
| CN | 105957938 | 9/2016 |

(Continued)

OTHER PUBLICATIONS

"Office Action of Korea Counterpart Application", issued on Mar. 18, 2024, p. 1-p. 6.

(Continued)

*Primary Examiner* — Christine S. Kim
*Assistant Examiner* — Tien Tran
(74) *Attorney, Agent, or Firm* — JCIPRNET

(57)          ABSTRACT

A micro light-emitting diode display device including a circuit substrate, an epitaxy structure and a conducting layer is provided. The epitaxy structure is electrically connected to the circuit substrate, and includes a connection layer and a plurality of light-emitting mesas. The plurality of light-emitting mesas are disposed on the connection layer, wherein a thickness of the connection layer is less than a thickness of the plurality of light-emitting mesas, and the connection layer has a first surface exposed by the plurality of light-emitting mesas and a second surface opposite to the first surface. The conducting layer is disposed on the second surface of the connection layer and exposes a plurality of sub-areas of the second surface, wherein a vertical projection of the conductive layer onto the connection layer overlaps a vertical projection of the first surface onto the connection layer.

10 Claims, 7 Drawing Sheets

(51) Int. Cl.

| | |
|---|---|
| *H10D 86/40* | (2025.01) |
| *H10H 20/819* | (2025.01) |
| *H10H 20/841* | (2025.01) |
| *H10H 20/851* | (2025.01) |
| *H10H 20/855* | (2025.01) |
| *H10H 20/856* | (2025.01) |
| *H10H 29/14* | (2025.01) |

(52) U.S. Cl.

CPC ......... *H10H 20/857* (2025.01); *H10H 20/819* (2025.01); *H10H 29/142* (2025.01)

(56) References Cited

U.S. PATENT DOCUMENTS

| | | |
|---|---|---|
| 2015/0008392 A1 | 1/2015 | Bonar et al. |
| 2018/0047876 A1 | 2/2018 | Chu et al. |
| 2018/0190712 A1 | 7/2018 | Xu et al. |
| 2020/0035748 A1* | 1/2020 | Xia ........................ G02B 5/201 |
| 2020/0259055 A1 | 8/2020 | Iguchi et al. |
| 2020/0303585 A1 | 9/2020 | Lo et al. |
| 2021/0150978 A1 | 5/2021 | Iguchi et al. |
| 2021/0175278 A1* | 6/2021 | Lo ........................ H10H 20/856 |
| 2021/0183301 A1 | 6/2021 | Choi et al. |
| 2022/0131040 A1 | 4/2022 | Chen et al. |

FOREIGN PATENT DOCUMENTS

| | | |
|---|---|---|
| CN | 106687893 | 5/2017 |
| CN | 110416245 | 11/2019 |
| CN | 112259572 | 1/2021 |
| CN | 113299803 | 8/2021 |
| JP | 2005322847 | 11/2005 |
| JP | 2021089427 | 6/2021 |
| KR | 20210070926 | 6/2021 |
| TW | 200539479 | 12/2005 |
| TW | 202123503 | 6/2021 |
| WO | 2020100302 | 5/2020 |

OTHER PUBLICATIONS

"Office Action of China Counterpart Application", issued on Jun. 6, 2025, p. 1-p. 8.

"Office Action of Japan Counterpart Application", issued on Aug. 1, 2023, p. 1-p. 3.

"Office Action of Taiwan Counterpart Application", issued on Aug. 11, 2023, p. 1-p. 6.

"Office Action of China Counterpart Application", issued on Feb. 27, 2025, p. 1-p. 9.

"Office Action of China Counterpart Application", issued on Aug. 27, 2025, p. 1-p. 11.

* cited by examiner

102S

PX(20)

30

PX(20)

102S

30

1

A2

A1

A2

I

I

D1

D2

D3

102G(20G)

PX(20)

30A

2

A2

A1

II

II

D1

D2

D3

MICRO LIGHT-EMITTING DIODE DISPLAY DEVICE

CROSS-REFERENCE TO RELATED APPLICATION

This application claims the priority benefit of Taiwan application serial no. 110130934, filed on Aug. 20, 2021. The entirety of the above-mentioned patent application is hereby incorporated by reference herein and made a part of this specification.

BACKGROUND

Technical Field

The disclosure relates to a display device, and in particular relates to a micro light-emitting diode display.

Description of Related Art

Multiple pixels in a micro light-emitting diode display may be formed by disposing multiple semiconductor light-emitting mesas on a semiconductor connection layer. Each of the semiconductor light-emitting mesas corresponds to a sub-pixel, and is arranged on the semiconductor connection layer in the form of an array. In addition to being the connection layer, the semiconductor connection layer may also serve as the common electrode of each of the light-emitting mesas, and is electrically connected to the circuit substrate through the bonding metal layers.

However, the resistance value of the semiconductor connection layer is higher than that of a conductor. The number of recombining electron-hole pairs is lower for the light-emitting mesas that are farther away from the common ground point. In contrast, the number of recombining electron-hole pairs is higher for the light-emitting mesas that are closer to the common ground point. Therefore, the brightness of the micro light-emitting diode display may be nonuniform.

SUMMARY

The disclosure provides a micro light-emitting diode display device having uniform light-emitting brightness.

According to an embodiment of the disclosure, a micro light-emitting diode display device including a circuit substrate, an epitaxy structure and a conductive layer is provided. The epitaxy structure is electrically connected to the circuit substrate, and includes a connection layer and a plurality of light-emitting mesas. The light-emitting mesas are disposed on the connection layer, wherein a thickness of the connection layer is less than a thickness of the light-emitting mesas, and the connection layer has a first surface exposed by the light-emitting mesas and a second surface opposite to the first surface. The conductive layer is disposed on the second surface of the connection layer and exposes a plurality of sub-areas of the second surface, wherein a vertical projection of the conductive layer onto the connection layer overlaps a vertical projection of the first surface onto the connection layer.

According to another embodiment of the disclosure, a micro light-emitting diode display device including a circuit substrate, an epitaxy structure and a transparent conductive layer is provided. The epitaxy structure is electrically connected to the circuit substrate, and includes a connection layer and a plurality of light-emitting mesas. The light-emitting mesas are disposed on the connection layer, wherein the connection layer has a first surface exposed by the light-emitting mesas and a second surface opposite to the first surface. The transparent conductive layer is disposed on the second surface of the connection layer, wherein the transparent conductive layer completely covers the second surface.

Based on the above, in the micro light-emitting diode display device provided by the embodiments of the disclosure, the conductive layer is disposed on the connection layer of the epitaxy structure. Since the resistance value of the conductive layer is less than the resistance value of the connection layer, the current of the circuit substrate may be transmitted more evenly through the conductive layer. In this case, for the light-emitting mesas with different distances from the common ground point, the same potential difference may drive the same number of recombining electron-hole pairs, which may prevent the micro light-emitting diode display device from having nonuniform brightness. In addition, as the resolution requirements become higher, the arrangement of the light-emitting mesas (sub-pixels) becomes denser. In contrast with the conventional situation in which the conductive layer is disposed on the first surface of the connection layer, the conductive layer of the disclosure is disposed on the second surface, which greatly improves the yield.

In order to make the above-mentioned features and advantages of the disclosure comprehensible, embodiments accompanied with drawings are described in detail below.

DETAILED DESCRIPTION OF DISCLOSED EMBODIMENTS

Figure 1A:
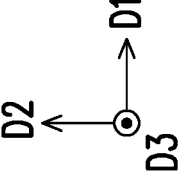
FIG. 1A illustrates a plan schematic view of a micro light-emitting diode display device according to an embodiment of the disclosure.
Figure 1B:
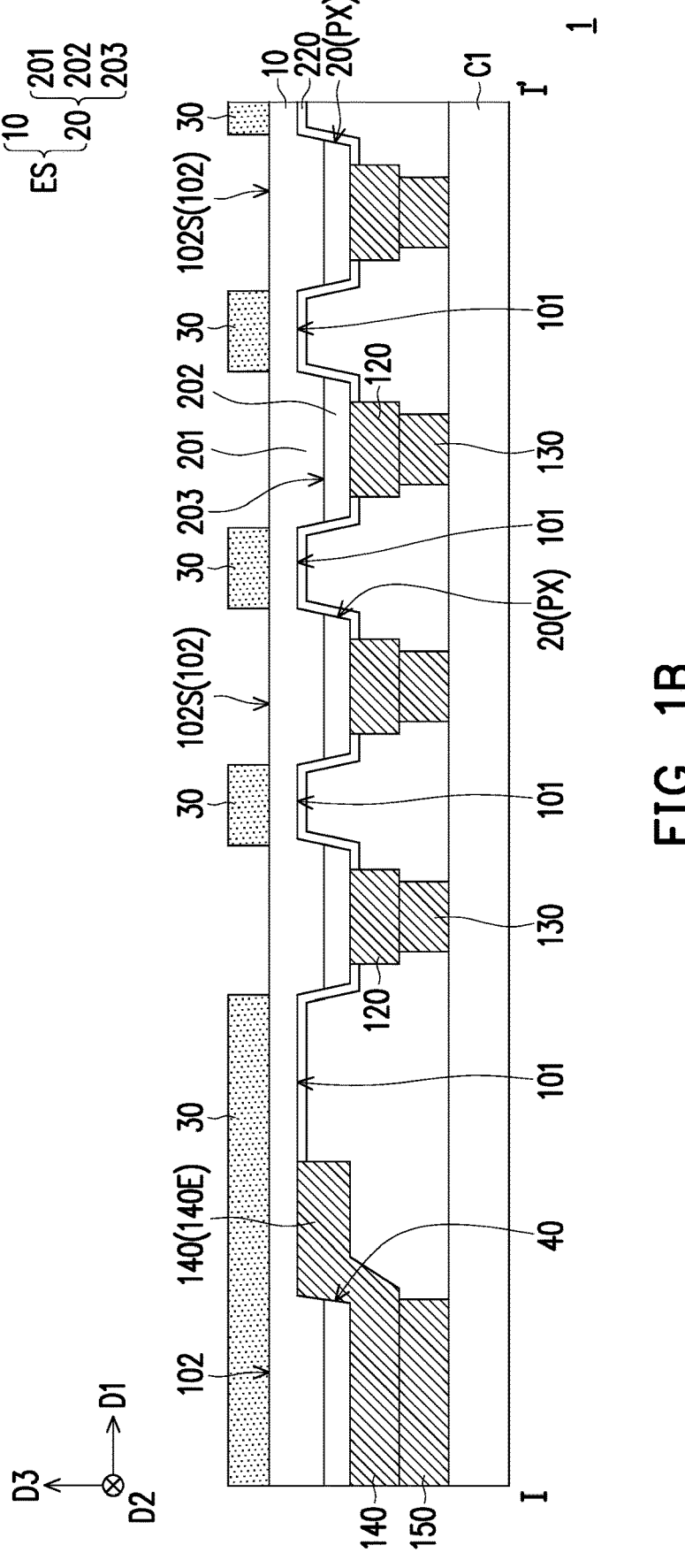
FIG. 1B illustrates a cross-sectional schematic view along the line I-I' shown in FIG. 1A.

Referring to FIG. 1A and FIG. 1B, a micro light-emitting diode display device 1 has a display area A1 and a non-display area A2, and includes a circuit substrate C1, an epitaxy structure ES, and a conductive layer 30. The display area A1 refers to an area in which a plurality of display sub-pixels PX are disposed, and the non-display area A2 is disposed at least partially around the display area A1 and may be an area in which a plurality of driving elements (not shown) are disposed. Each of the display sub-pixels PX has a light-emitting mesa 20 to provide image light of the micro light-emitting diode display device 1.

The epitaxy structure ES includes a connection layer 10 and a plurality of light-emitting mesas 20. As shown in FIG. 1B, a plurality of light-emitting mesas 20 respectively corresponding to a plurality of display sub-pixels PX are disposed on the connection layer 10, and each of the light-emitting mesas 20 includes a first-type semiconductor layer 201, a second-type semiconductor layer 202, and a light-emitting layer 203, wherein the light-emitting layer 203 is a multiple quantum well (MQW). The connection layer 10 is disposed on a plane parallel to the plane formed by the first direction D1 and the second direction D2, and has a first surface 101 exposed by the light-emitting mesas 20, and a second surface 102 opposite to the first surface 101.

According to an embodiment of the disclosure, the connection layer 10 is an n-type semiconductor, the first-type semiconductor layer 201 is an n-type semiconductor, and the second-type semiconductor layer 202 is a p-type semiconductor, but the disclosure is not limited thereto. In another embodiment of the disclosure, the connection layer 10 is a p-type semiconductor, the first-type semiconductor layer 201 is a p-type semiconductor, and the second-type semiconductor layer 202 is an n-type semiconductor. In particular, the connection layer 10 and the first-type semiconductor layer 201 may be integrally formed, that is, the two are the same layer. For example, through an etching process, the plurality of separated first-type semiconductor layers 201 and the continuous connection layer 10 are formed, which may increase the yield of mass transfer to the circuit substrate C1, and use the connection layer 10 as a common electrode to reduce power consumption.

The circuit substrate C1 may be, for example, a complementary metal-oxide-semiconductor (CMOS) substrate, a liquid crystal on silicon (LCOS) substrate, a thin film transistor (TFT) substrate, or other substrates with working circuits, which are not limited thereto. As shown in FIG. 1B, the epitaxy structure ES is electrically connected to the circuit substrate C1 through the bonding metal layer 120, the bonding metal layer 130, the bonding metal layer 140, and the bonding metal layer 150, wherein the bonding metal layer 140 and the bonding metal layer 150 are the common ground point.

When a voltage is applied to a bonding metal layer 120 via the circuit substrate C1 such that a potential difference is present between the bonding metal layer 120 and the common ground point, the potential difference generates a current, and the electron-hole-pair recombination occurs in the light-emitting mesa 20 connecting the bonding metal layer 120 to which the voltage is applied, thereby generating light. The light emitted by the light-emitting mesa 20 exits the micro light-emitting diode display device 1 along a direction substantially parallel to a third direction D3, and enters the eyes of the user, wherein the first direction D1, the second direction D2, and the third direction D3 are perpendicular to one another.

Since the connection layer 10 serving as the common electrode is a semiconductor, its resistance value is higher than that of a conductor. When a predetermined potential difference is applied to the common ground point and the bonding metal layer 120 farther away from the common ground point, the number of the recombining electron-hole pairs in the corresponding light-emitting mesa 20 is lower. When the same potential difference is applied to the common ground point and the bonding metal layer 120 closer to the common ground point, the number of the recombining electron-hole pairs in the corresponding light-emitting mesa 20 is higher. In order to avoid the above situation, the conductive layer 30 is disposed on the second surface 102 of the connection layer 10, and the thickness of the connection layer 10 in the third direction D3 is configured to be less than the thickness of the light-emitting mesa 20, so as to utilize the conductive layer 30 with lower resistance to assist in transmitting the current, such that the current may be evenly distributed. Even if the same potential difference is applied to the common ground point and the bonding metal layer 120 that is farther away from the common ground point. the number of the recombining electron-hole pairs in the corresponding light-emitting mesa 20 is not lower. The light emitted from the light-emitting mesa 20 is prevented from being reflected in the interior of the connection layer 10. Light loss is avoided. Therefore, the light-emitting mesas 20 of the micro light-emitting diode display device 1 may have the same brightness when same potential differences are applied thereto, and the micro light-emitting diode display device 1 may have good brightness uniformity.

When the area of the conductive layer 30 is larger, the current is more evenly distributed, and the brightness uniformity of the micro light-emitting diode display device 1 is better. If the vertical projection of the conductive layer 30 onto the connection layer 10 is a first projection, and the vertical projection of the first surface 101 onto the connection layer 10 is a second projection. in one embodiment, the area of the overlapping portion of the first projection and the second projection is greater than or equal to 0.5 times the area of the second projection. In one embodiment, the vertical projection of the first surface 101 onto the connection layer 10 (i.e., the second projection) completely falls within the vertical projection of the conductive layer 30 onto the connection layer 10 (i.e., the first projection). In another embodiment, the vertical projection of the first surface 101 onto the connection layer 10 (i.e., the second projection) completely falls within the vertical projection of the conductive layer 30 onto the connection layer 10 (i.e., the first projection), and the area of the overlapping portion of the first projection and the second projection is equal to the area of the second projection.

In this embodiment, the conductive layer 30 is an opaque high-conductivity material, such as gold, titanium, aluminum, silver, platinum, and alloys thereof. Therefore, the conductive layer 30 is configured to expose a plurality of sub-areas 102S of the second surface 102, and the sub-areas 102S respectively correspond to the light-emitting mesas 20. Specifically, as shown in FIG. 1B, the vertical projections of the sub-areas 102S onto the connection layer 10 respectively overlap the vertical projections of the light-emitting mesas 20 onto the connection layer 10, such that the light emitted by each of the light-emitting mesas 20 may penetrate the corresponding sub-area 102S and then exit the micro light-emitting diode display device 1. The vertical projection of the conductive layer 30 onto the connection layer 10 overlaps the vertical projection of the first surface 101 onto the connection layer 10 and does not overlap with the vertical projection of the light-emitting mesas 20 onto the connection layer 10, but the disclosure is not limited thereto. In an embodiment of the disclosure, the vertical projection of the conductive layer 30 onto the connection layer 10 partially overlaps the vertical projections of at least a part of the light-emitting mesas 20 onto the connection layer 10. In other words, the areas of vertical projection of at least a part of the sub-areas 102S onto the connection layer 10 is smaller than the areas of vertical projection of the corresponding light-emitting mesas 20 onto the connection layer 10. Under such a configuration, the light emitted by the light-emitting mesas 20 is further restricted by the conductive layer 30, and the light travels in a more concentrated direction, which avoids crosstalk between the display sub-pixels PX. Preferably, the ratio between the vertical projections of at least a part of the sub-areas 102S onto the connection layer 10 and the vertical projections of the corresponding light-emitting mesas 20 onto the connection layer 10 is between 0.5 and 1, and if the ratio is less than 0.5, the light extraction rate may be insufficient.

Further, since the conductive layer 30 is an opaque high-conductivity material, its thickness is configured to be less than or equal to the thickness of the epitaxy structure ES, so as to reduce the amount of light absorbed by the conductive layer 30. It should also be noted that the total area of the conductive layer 30 disposed in the display area A1 is larger than the total area of the conductive layer 30 disposed in the non-display area A2, so as to ensure that the current can be transmitted more evenly in the conductive layer 30 of the display area A1. Each of the light-emitting mesas 20 has the same brightness when the same potential difference is applied thereto.

In this embodiment, the micro light-emitting diode display device 1 further includes a semiconductor pad 40, wherein the semiconductor pad 40, and the bonding metal layers 140, 150 serving as the common ground point, are all disposed in the non-display area A2, and the light-emitting mesas 20 are disposed in the display area A1.

The semiconductor pad 40 and the light-emitting mesas 20 may be fabricated in the same process and have similar structures. Since the top surfaces of each light-emitting mesa 20 and the semiconductor pad 40 on the side away from the connection layer 10 is coplanar, the yield of the process for respectively bonding the bonding metal layer 150 and the bonding metal layer 130 on the circuit substrate C1 to the bonding metal layer 140 and the bonding metal layer 120 can be improved. Further, the bonding metal layer 140 has an epitaxial section 140E, such that the bonding metal layer 140 may be electrically connected between the connection layer 10 and the bonding metal layer 150.

In order to fully illustrate the various embodiments of the disclosure, other embodiments of the disclosure are described below. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2A:
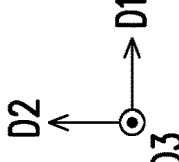
FIG. 2A illustrates a plan schematic view of a micro light-emitting diode display device according to an embodiment of the disclosure.
Figure 2B:
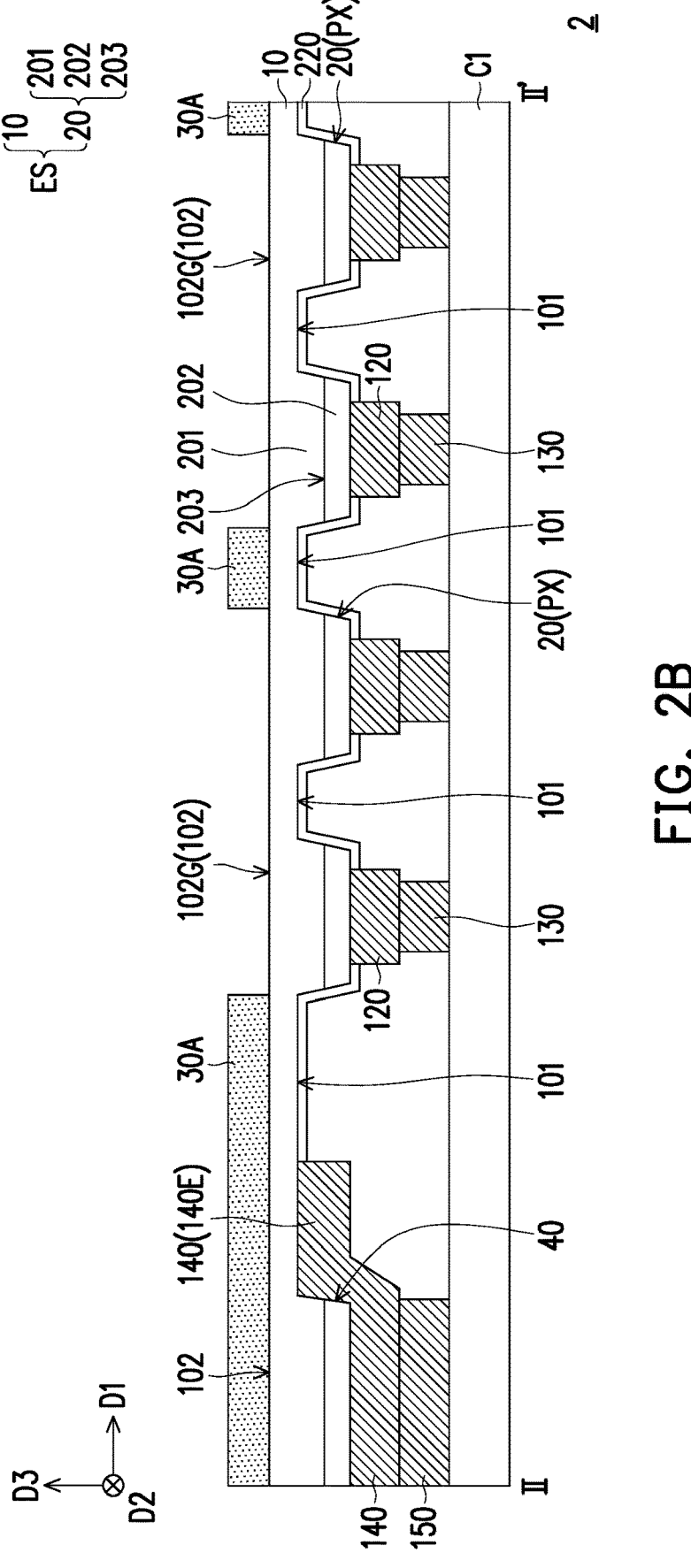
FIG. 2B illustrates a cross-sectional schematic view along the line II-II' shown in FIG. 2A.

Referring to FIG. 2A and FIG. 2B, a micro light-emitting diode display device 2 has a display area A1 and a non-display area A2, and includes a circuit substrate C1, an epitaxy structure ES, and a conductive layer 30A. A plurality of light-emitting mesas 20 are grouped into multiple light-emitting mesa groups 20G in units of four light-emitting mesas 20, and the conductive layer 30A is configured to expose a plurality of sub-areas 102G of the second surface 102, wherein the sub-areas 102G respectively correspond to the light-emitting mesa groups 20G. However, the disclosure is not limited thereto. In some embodiments, the light-emitting mesas 20 of the micro light-emitting diode display device 2 are grouped into a plurality of light-emitting mesa groups 20G in units of at least three light-emitting mesas 20. When the color conversion elements (not shown, such as quantum dots) are subsequently disposed on the second surface 102 corresponding to the at least three light-emitting mesas 20, the at least three light-emitting mesas 20 may respectively emit red light, green light and blue light, and form a full-color display device.

Similar to the micro light-emitting diode display device 1, the total area of the conductive layer 30A disposed in the display area A1 of the micro light-emitting diode display device 2 is larger than the total area of the conductive layer 30A disposed in the non-display area A2, to ensure that the current may be transmitted more evenly in the conductive layer 30A of the display area A1. Each of the light-emitting mesas 20 has the same brightness when the same potential difference is applied thereto.

Figure 3:
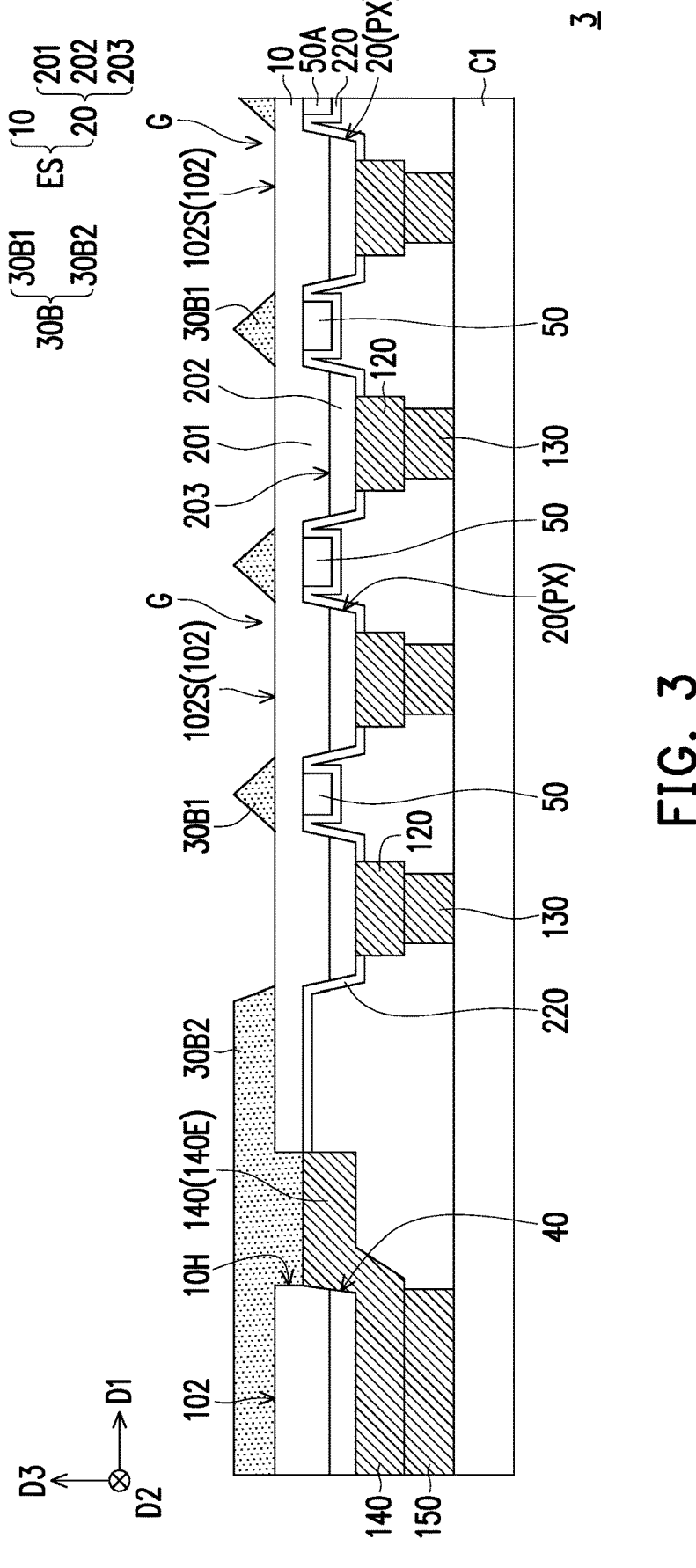
FIG. 3 to FIG. 5 are cross-sectional schematic views of the micro light-emitting diode display devices according to the embodiments of the disclosure.

Referring to FIG. 3, a micro light-emitting diode display device 3 has a display area and a non-display area, and includes a circuit substrate C1, an epitaxy structure ES, a conductive layer 30B, a conductive layer 50, and an insulating layer 220. The conductive layer 30B includes a conductive layer 30B1 disposed in the display area and a conductive layer 30B2 disposed in the non-display area.

A width of the conductive layer 30B1 decreases in the direction away from the second surface 102 (i.e., along the positive direction of the third direction D3), and the conductive layer 30B1 shows a bottom wide and top narrow view. The cross-sectional view of the conductive layer 30B1 shown in FIG. 3 has a conical shape, such that the light emitted by the corresponding light-emitting mesas 20 may be reflected and concentrated more toward the center. When the color conversion elements (not shown, such as quantum dots) are subsequently disposed on the second surface 102 corresponding to the light-emitting mesas 20, the grooves G formed in the conductive layer 30B1 provide the accommodation spaces having larger machining allowance for the color conversion elements disposed therein. In other embodiments, the width of the conductive layer 30B1 decreases in a direction away from the second surface 102, and the conductive layer 30B1 has a trapezoidal shape in a cross-sectional view.

The conductive layer 30B2 in the non-display area is also disposed in a through hole 10H penetrating the connection layer 10 to electrically connect to the bonding metal layer 140, the bonding metal layer 150 and the circuit substrate C1. The current from the circuit substrate C1 is sequentially transmitted to the bonding metal layer 150, the bonding metal layer 140, and the conductive layer 30B2 in the through hole 10H, so as to reach the conductive layer 30B2 and the conductive layer 30B1 on the second surface 102 without passing through the connection layer 10 having a higher resistance. The total area of the conductive layer 30B1 disposed in the display area is larger than the total area of the conductive layer 30B2 disposed in the non-display area, so as to ensure that the current may be transmitted more evenly in the conductive layer 30B1. Each of the light-emitting mesas 20 has the same brightness when the same potential difference is applied thereto.

The micro light-emitting diode display device 3 in this embodiment further includes another conductive layer 50 disposed on the first surface 101 of the connection layer 10. In other words, the conductive layer 50 is disposed between the light-emitting mesas 20. The conductive layer 50 is also configured to transmit the current from the circuit substrate C1, and the insulating layer 220 is disposed between the conductive layer 50 and the light-emitting mesas 20.

Figure 4:
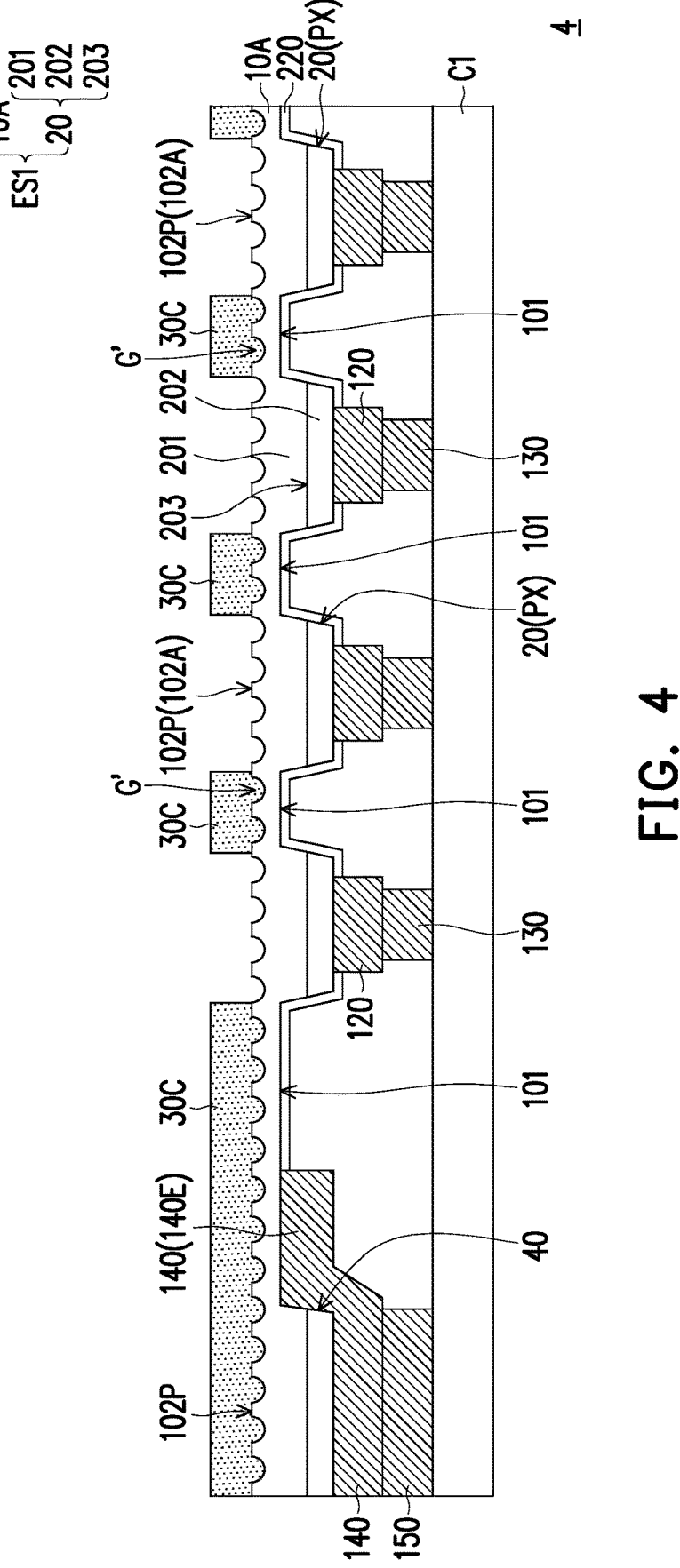

Referring to FIG. 4, the micro light-emitting diode display device 4 includes a circuit substrate C1, an epitaxy structure ES1 and a conductive layer 30C.

The epitaxy structure ES1 includes a connection layer 10A and a plurality of light-emitting mesas 20. The connection layer 10A may be formed by epitaxial growth on a patterned epitaxial substrate, and includes a plurality of three-dimensional patterns 102P, wherein the three-dimensional patterns 102P are disposed on a second surface 102A. That is, the connection layer 10A is different from the connection layer 10 shown in FIG. 1B in that the second surface 102 of the connection layer 10 is flat, and the second surface 102A of the connection layer 10A has a plurality of three-dimensional patterns 102P. The conductive layer 30C is disposed in a plurality of grooves G' of the three-dimensional patterns 102P. In such a situation, the contact area between the conductive layers 30C disposed on the three-dimensional patterns 102P and the second surface 102A is larger than the contact area between the conductive layer 30 and the second surface 102 in FIG. 1B, improving the bonding yield between the connection layer 10A and the conductive layer 30C, and improving the transfer efficiency of the current from the circuit substrate C1.

The conductive layer 30, the conductive layer 30A, the conductive layer 30B, and the conductive layer 30C described above are opaque conductive layers. However, the disclosure is not limited thereto. In some embodiments, the conductive layer 30, the conductive layer 30A, the conductive layer 30B, and the conductive layer 30C are transparent conductive layers.

Figure 5:
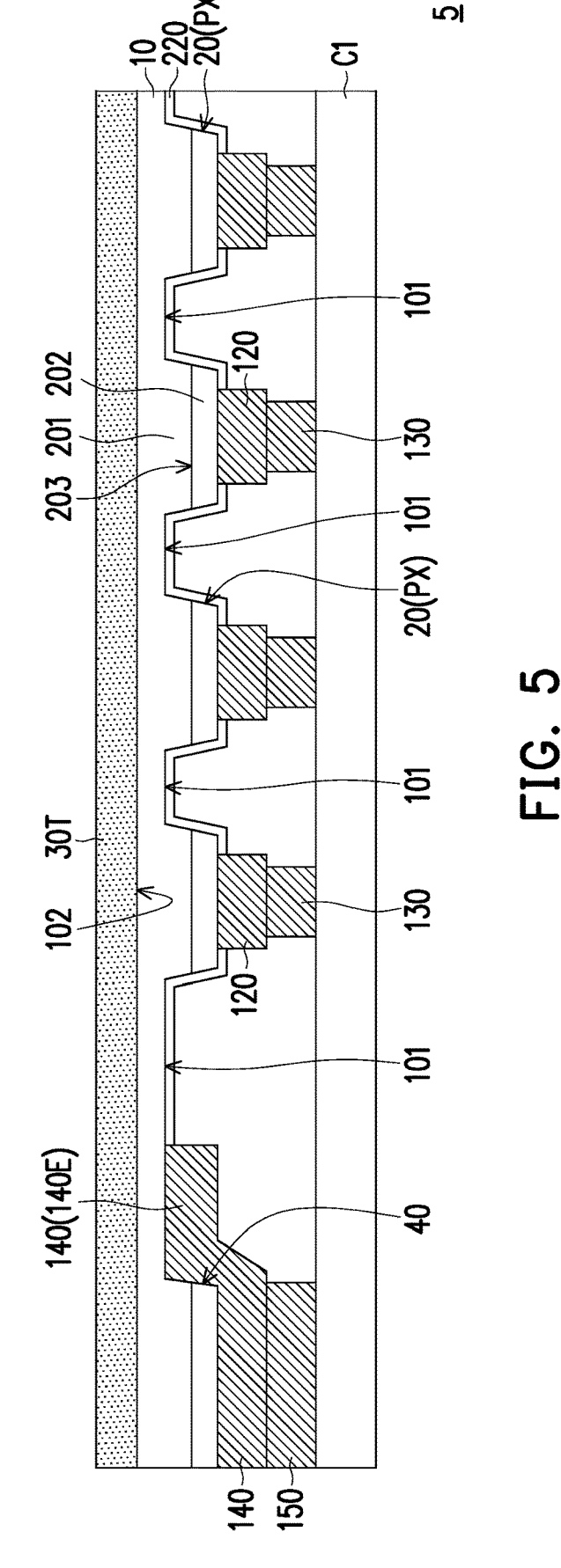

Referring to FIG. 5, a micro light-emitting diode display device 5 includes a circuit substrate C1, an epitaxy structure ES and a transparent conductive layer 30T. The transparent conductive layer 30T is disposed on the second surface 102 of the connection layer 10, and completely covers the second surface 102. The material of the transparent conductive layer 30T may be an oxidized metal material such as indium tin oxide (ITO) or zinc oxide (ZnO). Since light can penetrate the transparent conductive layer 30T, it is not needed to expose a plurality of sub-areas of the second surface as the various opaque conductive layers do in the previous embodiments, such that the contact area between the transparent conductive layer 30T and the second surface 102 is maximized, and the transfer efficiency of the current from the circuit substrate C1 is greatly improved.

To sum up, in the micro light-emitting diode display devices provided by the embodiments of the disclosure, the conductive layer is disposed on the connection layer of the epitaxy structure. Since the resistance value of the conductive layer is less than the resistance value of the connection layer, the current from the circuit substrate may be transmitted within the conductive layer. In this case, even if the light-emitting mesas have different distances from the common ground point, the same potential difference may drive the same number of electron-hole pairs to recombine in those light-emitting mesas, which may avoid uneven brightness of the micro light-emitting diode display devices. In addition, in contrast with the case in which the conductive layer is disposed on the first surface of the connection layer, the fabrication process placing the conductive layer on the second surface of the connection layer has a significantly higher yield.

What is claimed is:

1. A micro light-emitting diode display device, comprising a display area and a non-display area disposed at least partially around the display area, further comprising:
 a circuit substrate;
 an epitaxy structure, electrically connected to the circuit substrate, and comprising:
  a connection layer provided with a through hole in the non-display area; and a plurality of light-emitting mesas, disposed on the connection layer in the display area, wherein a thickness of the connection layer is less than a thickness of the light-emitting mesas, and the connection layer has a first surface exposed by the light-emitting mesas and a second surface opposite to the first surface; and a first conductive layer, disposed on the second surface of the connection layer and in the through hole to electrically connected to the circuit substrate, wherein a vertical projection of the first conductive layer onto the connection layer overlaps a vertical projection of the first surface onto the connection layer, wherein a plurality of sub-areas of the second surface corresponding to the light emitting mesas respectively are exposed.

2. The micro light-emitting diode display device according to claim 1, wherein the vertical projection of the first conductive layer onto the connection layer is a first projection, the vertical projection of the first surface onto the connection layer is a second projection, and an area of an overlapping portion of the first projection and the second projection is greater than or equal to 0.5 times an area of the second projection.

3. The micro light-emitting diode display device according to claim 2, wherein the second projection falls completely within the first projection.

4. The micro light-emitting diode display device according to claim 1, wherein a thickness of the first conductive layer is less than or equal to a thickness of the epitaxy structure.

5. The micro light-emitting diode display device according to claim 1, wherein areas of vertical projection of at least a part of the sub-areas onto the connection layer are smaller than areas of vertical projection of the corresponding light-emitting mesas onto the connection layer.

6. The micro light-emitting diode display device according to claim 1, wherein the light-emitting mesas are grouped into a plurality of light-emitting mesa groups, the first conductive layer exposes a plurality of sub-areas of the second surface, and the sub-areas respectively correspond to the light-emitting mesa groups.

7. The micro light-emitting diode display device according to claim 1, a total area of the first conductive layer disposed in the display area is larger than a total area of the first conductive layer disposed in the non-display area.

8. The micro light-emitting diode display device according to claim 1, wherein a width of the first conductive layer decreases in a direction away from the second surface.

9. The micro light-emitting diode display device according to claim 1, wherein the connection layer comprises a plurality of three-dimensional patterns disposed on the second surface, and the first conductive layer is disposed in a plurality of grooves formed by the three-dimensional patterns.

10. The micro light-emitting diode display device according to claim 1, further comprising a second conductive layer disposed on the first surface of the connection layer.

* * * * *